United States Patent [19]

Roos

[11] Patent Number: 4,803,419
[45] Date of Patent: Feb. 7, 1989

[54] TESTING HEAD DEVICE FOR A MICROWAVE NETWORK ANALYZER

[75] Inventor: Mark D. Roos, San Carlos, Calif.

[73] Assignee: EIP Microwave, Inc., San Jose, Calif.

[21] Appl. No.: 914,039

[22] Filed: Oct. 1, 1986

[51] Int. Cl.[4] .............................................. G01R 27/04
[52] U.S. Cl. .................................. 324/58 R; 324/58 B
[58] Field of Search ............... 324/58 R, 542, 58 B, 324/58.5 B, 58.5 R; 455/226; 364/481, 482, 484, 576

[56] References Cited

U.S. PATENT DOCUMENTS 4,580,092  4/1986  Squire ............................. 324/58 B
4,630,228  12/1986  Tarczy-Hornoch et al. ....... 324/542
4,680,538  7/1987  Dalman et al. .................. 324/58 B Primary Examiner—A. D. Pellinen
Assistant Examiner—H. L. Williams
Attorney, Agent, or Firm—Nilsson, Robbins, Dalgarn, Berliner, Carson & Wurst

[57] ABSTRACT

A testing head for attachment between a cable connected to a source of microwave test signals and a microwave device to be tested. In the testing head an appropriate sampling of transmitted and reflected test signals is accomplished, along with mixing thereof with a local oscillator signal to generate an intermediate frequency signal, which is then returned to a network analyzer for appropriate processing.

5 Claims, 1 Drawing Sheet

TESTING HEAD DEVICE FOR A MICROWAVE NETWORK ANALYZER

BACKGROUND

The present invention relates to devices for use in measuring the characteristics of microwave circuits.

Microwave circuits require special testing devices because of their unusual properties. Therefore, devices generally referred to as network analyzers have been developed to measure various microwave circuit characteristics such as reflection, transmission, gain, impedance and phase as a function of frequency and time.

These devices operate by establishing a test frequency, connecting to a standard circuit for calibrating the analyzer and then, after disconnecting the standard circuit, connecting to a device under test (DUT) for making the desired measurements.

However, present network analyzers have been subject to problems in use due to the system they employ for connecting to the calibration circuits and the circuits to be tested. Ordinarily they transmit a microwave test signal to the circuit to be tested along a transmission (coaxial or waveguide) line. The transmission line must be physically manipulated to make the actual connection with the calibration circuits and then manipulated again to connect and/or disconnect each circuit to be tested. These physical manipulations alter the microwave characteristics of the transmission line, thereby affecting the test signal and resulting in significant measurement errors.

These errors have been generated because the typical manner in which the measurements are taken is to generate a microwave signal at a source in the chassis of the measuring equipment and to provide also at the source the appropriate mixers and intermediate frequency (IF) circuits for developing the information containing signals. Therefore, the RF high frequency signals are transmitted over appropriate transmission lines to the DUT and the reflections are transmitted back over the transmission line from the DUT to the mixers. As a result, the calibration accomplished with the appropriate standards affixed to the cables includes the cables as part of the calibration. Thus even the slightest movement of the cables in removing the standard and attaching the DUT renders the calibrations at least somewhat erroneous if not invalid and in turn renders DUT measurements inaccurate to a like extent.

The present invention overcomes the aforementioned problems by providing a system in which manipulations of the transmission line between the network analyzer and the cirucit to be tested and other related changes in environmental conditions do not appreciably affect the measurement being made.

SUMMARY OF THE INVENTION

The present invention constitutes a testing head device for use with a microwave network analyzer and a resulting method for testing a microwave circuit. The testing head device comprises coupler means, mixer means and an appropriate IF section means. The testing head device is adapted to be directly coupled to the device under test or, alternatively, to the standard which is utilized for calibration of the system. An appropriate cabling means is then utilized for interconnection between the network analyzer chassis, which includes a source microwave test energy and a local oscillator means, and the testing head. Since the testing head device is decoupled from the microwave network analyzer chassis and is affixed to the device under test or the standard, the calibration which is accomplished does not include the transmission cables and thus manipulation of them in affixing the calibration standard or the device under test to the testing head device does not appreciably affect the validity of the calibration or the accuracy of the measurement as it is taken.

In operation, a microwave test signal of established frequency is supplied on the test line to the head which is connected to the DUT. The coupler means in the test head samples the microwave transmission and reflection signals going to and coming back from the DUT. These signals are then supplied to the mixer where they are mixed with a signal from the local oscillator. An intermediate frequency signal results from this mixing process, which is supplied back to the network analyzer, where it provides information about the characteristics of the DUT.

DESCRIPTION OF THE PREFERRED EMBODIMENT

Figure 1:
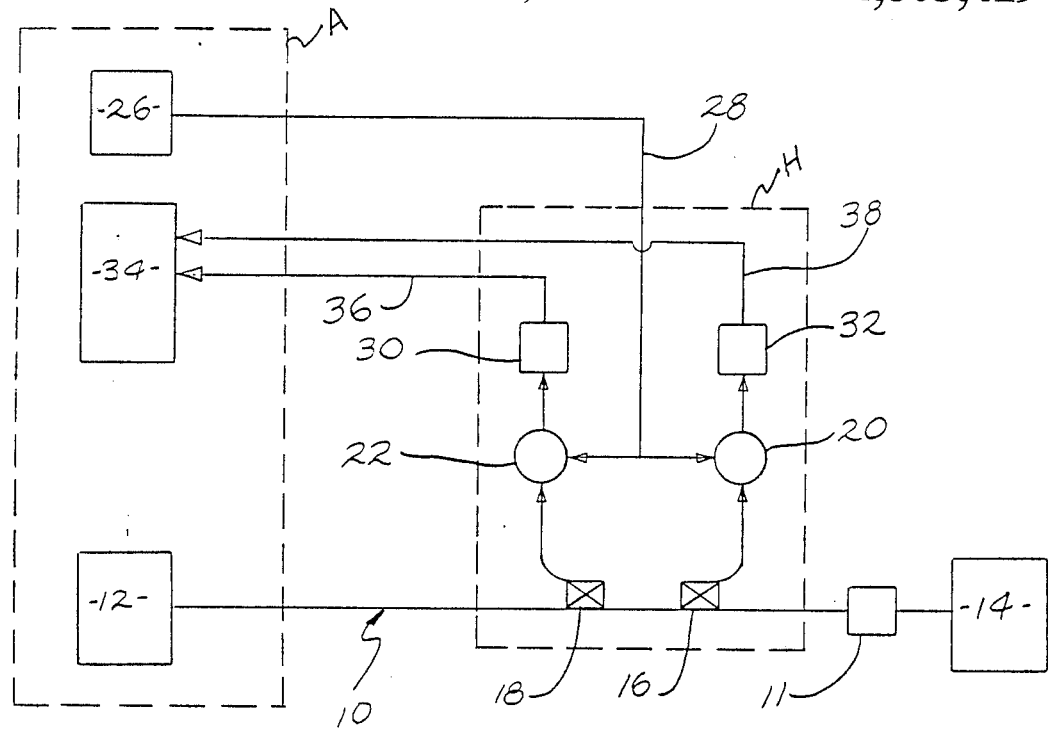
FIG. 1 is a block diagram of the components comprising the present invention.

Referring now to FIG. 1, the components of a testing head device H of the present invention are illustrated connected to a network analyzer system A and to a DUT 14. A test signal of the desired frequency for example, in the range of 10 megahertz to 30 gigahertz is supplied along the transmission line 10, which can be any conventional type of transmission line, suitable for carrying microwave energy such as a coaxial cable, strip line or waveguide. The line 10 runs from a source 12 of microwave energy in the analyzer A to the test head H and through it to port 11 which is the point of connection with the DUT 14. Within the head H are two directional couplers 16 and 18 which are coupled to the line 10. The coupler 16 directionally diverts a part of the test signal traveling toward the DUT 14 to the mixer 20. The coupler 18 directionally diverts part of the signal traveling away and reflected from the circuit 14 to the mixer 22.

The mixers 20 and 22 are also supplied along the line 28 with a stable signal of lower frequency, such as 1 gigahertz, from the local oscillator source 26. The mixers 20 and 22 are wideband balanced mixers which suppress even harmonics but allow odd harmonics to be generated and maintained in the mixers. A mixer such as a MINPAC low-profile wideband double-balanced mixer model WJ-M50A/M50AC manufactured by Watkins Johnson Industries would be suitable for this application. These odd harmonics which are available in the mixers 20 and 22 are mixed with the transmission and reflection signals picked up by the couplers 16 and 18. The mixing process results in an intermediate or beat frequency signal at the outputs of the mixers 20 and 22 which contain information about the characteristics of the DUT. From this information, such characteristics as transmission, gain, impedance, phase, reflection, etc., may be determined. The intermediate frequency outputs from the mixers 20 and 22 are supplied to the filters 30 and 32, respectively, which are of conventional construction and which may be either low pass frequency filters or band pass frequency filters, depending on the exact frequency of the signals desired to be produced and the frequency of the signals desired to be suppressed. It is preferred to employ low pass filters which will result in production of intermediate frequency signals in the range of 5–15 or 950–1050 megahertz. The intermediate frequency signals passed through the filters 30 and 32 are then transmitted to the network analyzer 34 along the lines 36 and 38, respectively.

Figure 2:
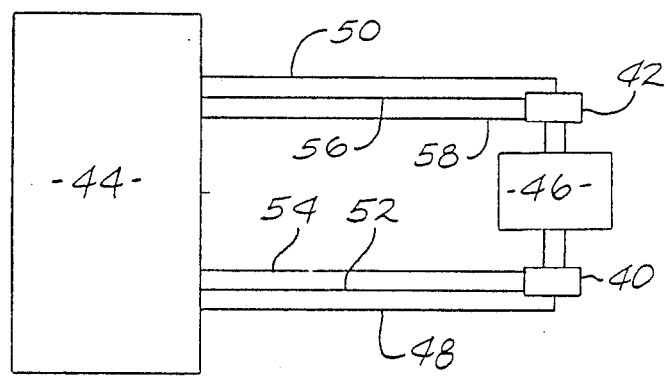
FIG. 2 is a diagrammatic view of the present invention connected to a device under test.

As shown in FIG. 2, it is generally preferred to employ two testing heads 40 and 42 with each network analyzer 44 and DUT 46. The first testing head 40 is connected to the test line 48 along which the test signal is supplied as an input to the device 46. The second testing head 42 is connected to a test line 50 along which signals are transmitted as outputs from the device 46. The testing head 42 effectively diverts test signal outputs from the device 46 including both output transmitted from and reflected back to the device. The network analyzer 44 measures the amplitude and phase of the intermediate frequency signals received on lines 52, 54, 56 and 58. When these measurements are anlayzed and compared with similar data produced as a result of applying standards such as open circuits and known terminations to the lines 48 and 50, information about the electrical characteristics of the circuit being tested such as its reflection, transmission, gain, impedance and phase properties may be derived by the network analyzer 44.

While the system of this invention has been described in conjunction with a particular preferred embodiment, it should be apparent that certain changes could be made without departing from the principles of the invention.

What is claimed is:

1. A remote testing head for use with an apparatus for analyzing microwave devices including means for generating microwave frequency signals and local oscillator means for generating a local oscillator signal, said test head being adapted to be connected directly to a microwave device under test and comprising:
   means on said test heads for connecting said test head to said DUT at a point remote from said analyzing apparatus;
   coupler means in said test head for sampling said microwave frequency test signal and microwave signals reflected from said DUT;
   mixer means in said test head coupled to said coupler means for mixing said sampled microwave signals with said signal from said local oscillator, thereby generating an intermediate frequency (IF) signal which includes information about the characteristics of said DUT; and
   cable means interconnected between said analyzing apparatus and aid test head for transmitting said microwave frequency test signals and said local oscillator signal from said analyzing apparatus to said test head and said IF signals from said test heat to said analyzing apparatus.

2. A testing head as defined in claim 1 which further includes:
   a filter in said test head for suppressing signals of undesired frequencies accompanying said intermediate frequency signals.

3. A testing head as defined in claim 1 wherein said coupler means and said mixer means include:
   a first directional coupler connected for sampling part of said microwave frequency test signal traveling from said analyzing apparatus toward said DUT:
   a second directional coupler for sampling part of said microwave frequency test signal traveling away from said DUT;
   a first mixer for mixing said part of said test signal traveling toward said DUT with said local oscillator signal and generating a first intermediate frequency signal which includes information about said DUT;
   a second mixer for mixing said part of said test signal traveling away from said DUT with said local oscillator signal and generating a second intermediate frequency signal which includes information about said DUT.

4. A method for testing a microwave device (DUT) including the steps of:
   providing a source of microwave frequency test signals in a network analyzer;
   providing a source of local oscillator signals in said network analyzer;
   positioning said DUT at a position remote from said test signal and local oscillator signal sources, providing a test head separate and remote from said analyzer;
   connecting said test head to said DUT at said remote position;
   supplying said microwave test signal through said test head to said DUT at said remote position;
   sampling said test signal in said test head at said remote position;
   applying said sampled portion of said test signal to a mixer in said test head at said remote position;
   mixing said sampled portion of said test signal with said local oscillator signal in said test head at said remote position to generate a first intermediate frequency signal containing information about said DUT; and
   supplying said intermediate frequency signal to said network analyzer for deriving said information.

5. A method of testing DUT as defined in claim 4 which further includes the steps of sampling at said remote position microwave frequency signals received from said DUT, applying said signals from said DUT to a mixer at said remote position;
   mixing said signals from said DUT with said local oscillator signal at said remote position to generate a second intermediate frequency signal containing information about said DUT; and
   supplying said second intermediate frequency signal to a network analyzer for deriving said information.

* * * * *